(12) United States Patent
Lyu et al.

(10) Patent No.: US 11,300,865 B2
(45) Date of Patent: Apr. 12, 2022

(54) SYSTEMS FOR CONTROLLING LASER PROJECTOR AND MOBILE TERMINALS

(71) Applicant: GUANGDONG OPPO MOBILE TELECOMMUNICATIONS CORP., LTD., Guangdong (CN)

(72) Inventors: Xiangnan Lyu, Guangdong (CN); Jian Bai, Guangdong (CN); Biao Chen, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 419 days.

(21) Appl. No.: 16/421,043

(22) Filed: May 23, 2019

(65) Prior Publication Data

US 2019/0369474 A1 Dec. 5, 2019

(30) Foreign Application Priority Data

May 30, 2018 (CN) .......................... 201810539345.2
May 30, 2018 (CN) .......................... 201810539478.X

(51) Int. Cl.
  *G03B 21/20* (2006.01)
  *G05B 19/042* (2006.01)
(52) U.S. Cl.
  CPC ..... *G03B 21/2053* (2013.01); *G03B 21/2033* (2013.01); *G05B 19/042* (2013.01); *G05B 2219/25252* (2013.01)
(58) Field of Classification Search
  CPC .................. G03B 21/00–64; H04N 9/31–3197
  See application file for complete search history.

(56) References Cited

U.S. PATENT DOCUMENTS

| 5,298,750 A | 3/1994 | Rericha |
| 8,634,848 B1 | 1/2014 | Bozarth et al. |

(Continued)

FOREIGN PATENT DOCUMENTS

| CN | 2537509 | 2/2003 |
| CN | 101409589 | 4/2009 |

(Continued)

OTHER PUBLICATIONS

SIPO, First Office Action for CN Application No. 201810539345, dated Mar. 25, 2019.

(Continued)

*Primary Examiner* — Michelle M Iacoletti
*Assistant Examiner* — Christopher A Lamb, II
(74) *Attorney, Agent, or Firm* — Hodgson Russ LLP

(57) ABSTRACT

The present disclosure provides a mobile terminal and a system for controlling a laser projector. The system includes a first drive circuit, a second drive circuit, a microprocessor coupled to the first drive circuit, and an application processor. The first drive circuit is configured to output an electrical signal to the laser projector. The second drive circuit is configured to supply power to the first drive circuit. The application processor is configured to, read a preset signal from the microprocessor, and power off the second drive circuit to power off the first drive circuit and the laser projector, or send a reset signal for restarting the microprocessor to the microprocessor, in response to that the application processor cannot read the preset signal.

18 Claims, 10 Drawing Sheets

(56) References Cited

U.S. PATENT DOCUMENTS

| | | | |
|---|---|---|---|
| 2003/0079163 A1* | 4/2003 | Hashimoto | G06F 11/079 714/55 |
| 2006/0291510 A1 | 12/2006 | Juluri | |
| 2008/0276132 A1 | 11/2008 | Majewski et al. | |
| 2015/0257831 A1* | 9/2015 | Srinivasan | A61N 5/0601 606/3 |
| 2016/0125180 A1 | 5/2016 | Smith et al. | |
| 2017/0063027 A1 | 3/2017 | Saha | |
| 2018/0095528 A1 | 4/2018 | Tao et al. | |
| 2018/0131160 A1* | 5/2018 | Zhang | H01S 5/183 |

FOREIGN PATENT DOCUMENTS

| | | |
|---|---|---|
| CN | 102377102 | 3/2012 |
| CN | 203366017 | 12/2013 |
| CN | 105425661 | 3/2016 |
| CN | 105786657 | 7/2016 |
| CN | 106452599 | 2/2017 |
| CN | 106454287 | 2/2017 |
| CN | 107424187 | 12/2017 |
| CN | 206832993 | 1/2018 |
| CN | 108539575 | 9/2018 |
| CN | 108717280 | 10/2018 |
| JP | 2013250407 | 12/2013 |
| WO | 0115289 | 3/2001 |
| WO | 2008063678 | 5/2008 |
| WO | 2010017696 | 2/2010 |

OTHER PUBLICATIONS

SIPO, First Office Action for CN Application No. 201810539478, dated Mar. 25, 2019.

WIPO, English Translation of ISR/WO for PCT/US2019/077705, dated Jun. 5, 2019.

IPI, Office Action for IN Application No. 201914021139, dated Jan. 29, 2021.

EPO, Communication for EP Application No. 19177180.7, dated Nov. 12, 2020.

EPO, Office Action for EP Application No. 19177180.7, dated Jan. 30, 2020.

EPO, Office Action for EP Application No. 19177180.7, dated Oct. 30, 2019 Oct. 30, 2019.

SIPO, Third Office Action for CN Application No. 201810539345.2, dated Jun. 15, 2020.

SIPO, Fourth Office Action for ON Application No. 201810539478.X, dated Jun. 15, 2020.

* cited by examiner

SYSTEMS FOR CONTROLLING LASER PROJECTOR AND MOBILE TERMINALS

CROSS REFERENCE TO RELATED APPLICATION

This application claims priority to Chinese Patent Application Nos. 201810539478.X and 201810539345.2, each filed May 30, 2018, the entire disclosures of which are incorporated herein by reference.

TECHNICAL FIELD

The present disclosure relates to the field of consumer electronics technologies, and more particularly, to a system for controlling a laser projector, and a mobile terminal.

BACKGROUND

A mobile phone may be equipped with a laser generator for emitting laser light outward. However, when the mobile phone fails and crashes, the laser generator may continue to emit the laser light outward for a long period of time, and the laser light emitted for the long period of time is likely to harm the user, especially the user's eyes.

SUMMARY

Embodiments of the present disclosure provide a system for controlling a laser projector, and a mobile terminal.

The system for controlling the laser projector provided in the embodiments of the present disclosure includes: a first drive circuit, a second drive circuit, a microprocessor and an application processor. The first drive circuit is coupled to the laser projector. The first drive circuit is configured to output an electrical signal to drive the laser projector to project laser light. The second drive circuit is coupled to the first drive circuit. The second drive circuit is configured to supply power to the first drive circuit. The microprocessor is coupled to the first drive circuit. The application processor is coupled to the microprocessor and the second drive circuit. The application processor is configured to, read a preset signal from the microprocessor, and power off the second drive circuit to power off the first drive circuit and the laser projector, and/or send a reset signal for restarting the microprocessor to the microprocessor, in response to that the application processor cannot read the preset signal.

The mobile terminal provided in the embodiments of the present disclosure includes a laser projector and a system for controlling the laser projector. The system includes: a first drive circuit, a second drive circuit, a microprocessor and an application processor. The first drive circuit is coupled to the laser projector. The first drive circuit is configured to output an electrical signal to drive the laser projector to project laser light. The second drive circuit is coupled to the first drive circuit. The second drive circuit is configured to supply power to the first drive circuit. The microprocessor is coupled to the first drive circuit. The application processor is coupled to the microprocessor and the second drive circuit. The application processor is configured to, read a preset signal from the microprocessor, and power off the second drive circuit to power off the first drive circuit and the laser projector, and/or send a reset signal for restarting the microprocessor to the microprocessor, in response to that the application processor cannot read the preset signal.

Additional aspects and advantages of embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of embodiments of the present disclosure will become apparent and more readily appreciated from the following descriptions made with reference to the drawings, in which.

DETAILED DESCRIPTION

Figure 1:
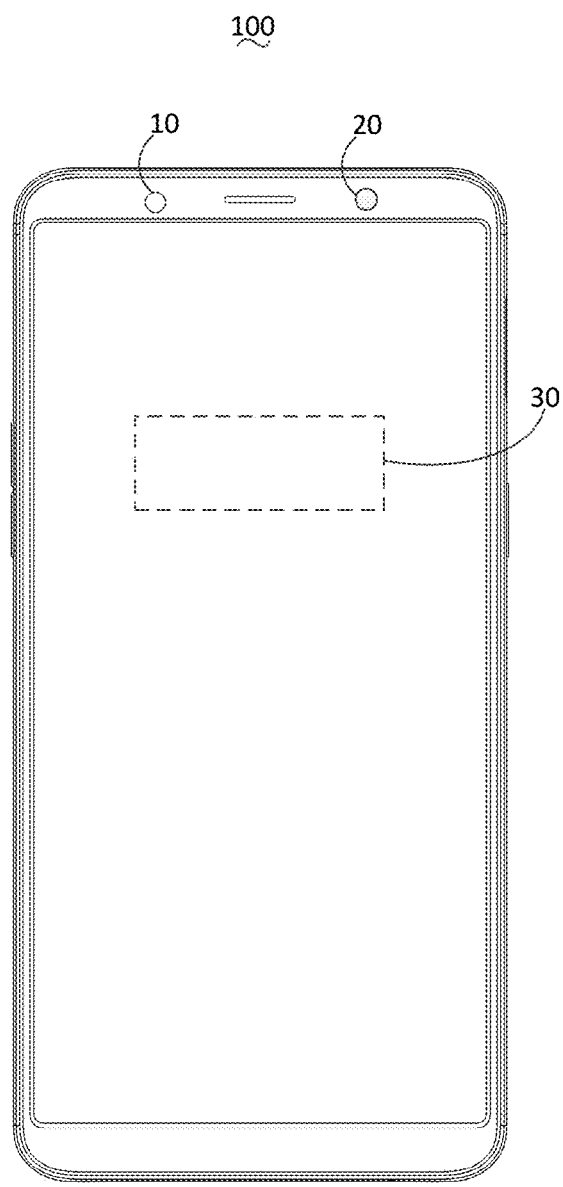
FIG. 1 illustrates a schematic diagram of a mobile terminal according to some embodiments of the present disclosure.

Reference will be made in detail to embodiments of the present disclosure with reference to drawings. The same or similar elements and the elements having same or similar functions are denoted by like reference numerals in the drawings throughout the descriptions.

The embodiments described herein with reference to the drawings are explanatory, illustrative, and used to generally understand the present disclosure. In addition, the embodiments shall not be construed to limit the present disclosure.

In the present disclosure, unless specified or limited otherwise, the first feature is "on" or "under" the second feature refers to the first feature and the second feature can be direct or via media indirect mountings, connections, and couplings. And, the first feature is "on", "above", "over" the second feature may refer to the first feature is right over the second feature or is diagonal above the second feature, or just refer to the horizontal height of the first feature is higher than the horizontal height of the second feature. The first feature is "below" or "under" the second feature may refer to the first feature is right over the second feature or is diagonal under the second feature, or just refer to the horizontal height of the first feature is lower than the horizontal height of the second feature.

Figure 2:
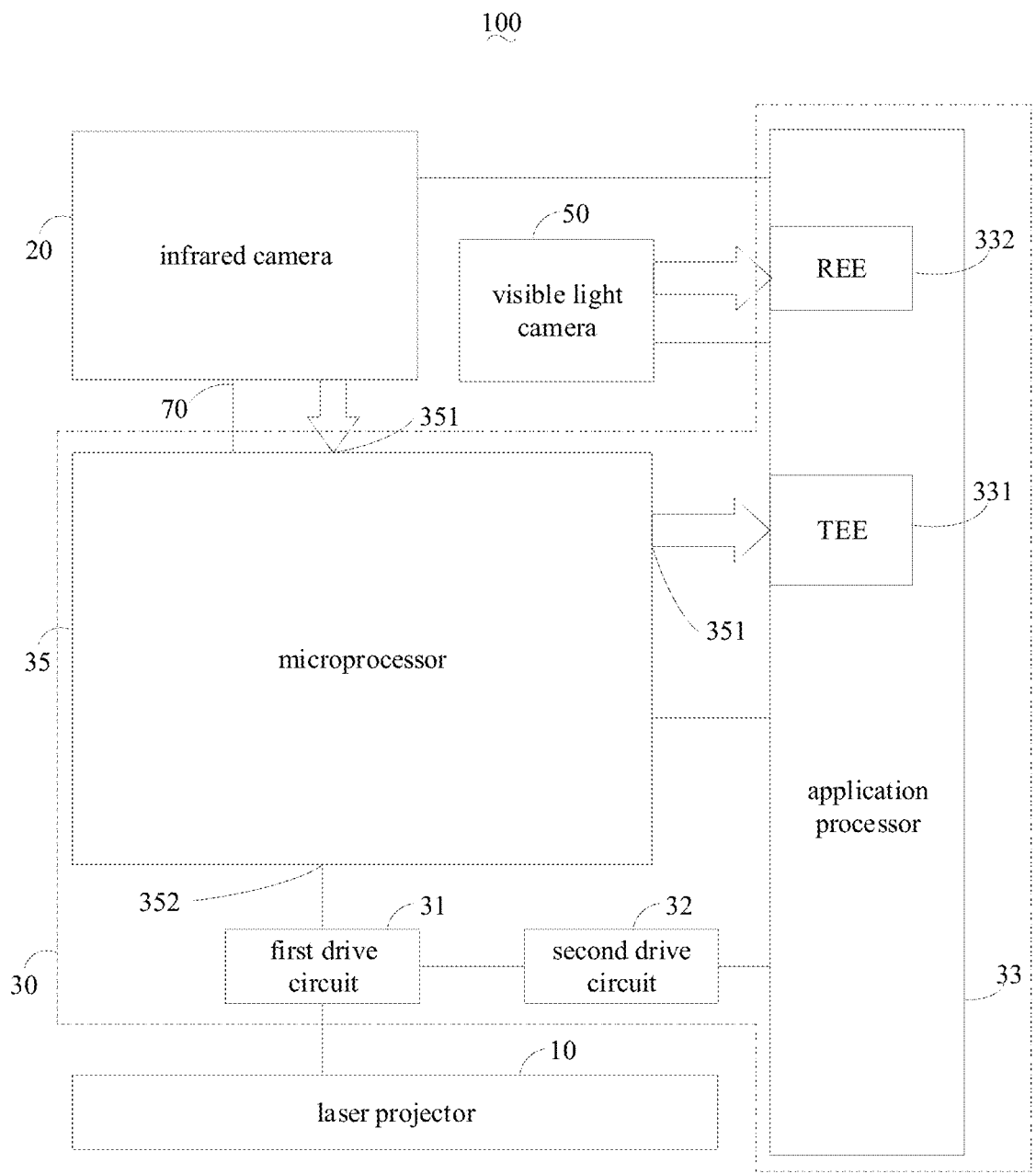
FIG. 2 illustrates a block diagram of a mobile terminal according to some embodiments of the present disclosure.

Referring to FIG. 1 and FIG. 2, a system 30 for controlling a laser projector 10 provided in an embodiment of the present disclosure includes a first drive circuit 31, a second drive circuit 32, a microprocessor 35 and an application processor 33. The first drive circuit 31 is coupled to the laser projector 10. The first drive circuit 31 is configured to output an electrical signal to drive the laser projector 10 to project laser light. The second drive circuit 32 is coupled to the first drive circuit 31. The second drive circuit 32 is configured to supply power to the first drive circuit 31. The microprocessor 35 is coupled to the first drive circuit 31. The application processor 33 is coupled to the microprocessor 35 and the second drive circuit 32. The application processor 33 is configured to, read a preset signal from the microprocessor 35, and power off the second drive circuit 32 to power off the first drive circuit 31 and the laser projector 10, and/or send a reset signal for restarting the microprocessor 35 to the microprocessor 35, in response to that the application processor 33 cannot read the preset signal.

Referring to FIG. 1 and FIG. 2, a mobile terminal 100 provided in an embodiment of the present disclosure includes a laser projector 10 and a system 30 for controlling the laser projector 10. The system 30 includes a first drive circuit 31, a second drive circuit 32, a microprocessor 35 and an application processor 33. The first drive circuit 31 is coupled to the laser projector 10. The first drive circuit 31 is configured to output an electrical signal to drive the laser projector 10 to project laser light. The second drive circuit 32 is coupled to the first drive circuit 31. The second drive circuit 32 is configured to supply power to the first drive circuit 31. The microprocessor 35 is coupled to the first drive circuit 31. The application processor 33 is coupled to the microprocessor 35 and the second drive circuit 32. The application processor 33 is configured to, read a preset signal from the microprocessor 35, and power off the second drive circuit 32 to power off the first drive circuit 31 and the laser projector 10, and/or send a reset signal for restarting the microprocessor 35 to the microprocessor 35, in response to that the application processor 33 cannot read the preset signal.

In the mobile terminal 100 and the system 30 provided in the embodiments of the present disclosure, the application processor 33 may determine that the microprocessor 35 is malfunctioning when the application processor 33 cannot read the preset signal from the microprocessor 35. When the microprocessor 35 is malfunctioning, it indicates that the microprocessor 35 cannot control the laser projector 10 through the first drive circuit 31. In other words, the laser projector 10 may operate normally, which may continuously emit laser light outward to damage the user. Under this case, there may be various ways of controlling the laser projector 10 when the microprocessor 35 is malfunctioning as following.

The application processor 33 may power off the second drive circuit 32 to power off the first drive circuit 31 and the laser projector 10. In other words, the application processor 33 may control the laser projector 10 to power off directly through the second drive circuit 32.

Or, the application processor 33 may send the reset signal for restarting the microprocessor 35 to the microprocessor 35. The malfunctioning microprocessor 35 may be restarted based on the reset signal, such that the microprocessor 35 operate normally. The operating normally microprocessor 35 may control the laser projector 10 through the first drive circuit 31, such that the laser projector 10 may operate normally. In other words, the application processor 33 may reset the microprocessor 35 to enable the microprocessor 35 to operate normally, so as to control the laser projector 10 to operate normally.

Or, the application processor 33 may power off the second drive circuit 32 to power off the first drive circuit 31 and the laser projector 10, and then send the reset signal for restarting the microprocessor 35 to the microprocessor 35. When the microprocessor 35 is malfunctioning, the laser projector 10 may operate unusually. First, the application processor 33 may control the laser projector 10 to power off directly through the second drive circuit 32, and then reset the microprocessor 35 to operate normally to control the laser projector 10 to operate normally.

Based on the above embodiments, it is prevented effectively the laser projector 10 from continuously emitting laser light outward to damage the user.

Referring to FIG. 1 and FIG. 2, a mobile terminal 100 provided in an embodiment of the present disclosure includes a laser projector 10, an infrared camera 20 and a system 30 for controlling the laser projector 10. The mobile terminal 100 may be a mobile phone, a tablet computer, a smart watch, a smart wristband, a smart wearable device, etc. In the embodiments of the present disclosure, an example of the mobile terminal 100 is the mobile phone, and the specific form of the mobile terminal 100 may be not limited to the mobile phone.

The laser projector 10 is capable of projecting laser light to a target object. The laser light may be infrared light. The laser light projected by the laser projector 10 may be a pattern with specific speckles or streaks. The infrared camera 20 is capable of collecting an infrared image of the target object, or receiving a laser pattern modulated by the target object. In order to obtain a clearer laser pattern, it is usually necessary to continuously emit a plurality of frames of laser light to the target object with a certain optical power. However, if the laser projector 10 continuously emits laser light outward, the laser light may burn the user, especially to the user's eyes. Therefore, it is necessary to prevent the laser projector 10 from continuously emitting laser light outward.

The system 30 includes a first drive circuit 31, a second drive circuit 32, an application processor 33 and a microprocessor 35.

The first drive circuit 31 is coupled to the laser projector 10. The first drive circuit 31 is configured to output an electrical signal to the laser projector 10, to drive the laser projector 10 to project laser light. In detail, the first drive circuit 31 serves as a current source of the laser projector 10. If the first drive circuit 31 is powered off, the laser projector 10 cannot emit laser light outward; or, the first drive circuit 31 stops outputting the electric signal to the laser projector 10, the laser projector 10 cannot emit laser light outward. The second drive circuit 32 is coupled to the first drive circuit 31. The second drive circuit 32 is configured to supply power to the first drive circuit 31. For example, the first drive circuit 31 may be a DC/DC circuit. The first drive circuit 31 may be separately packaged as a drive chip, and the second drive circuit 32 may be separately packaged as a drive chip, or the first drive circuit 31 and the second drive circuit 32 may be packaged together in one drive chip. The drive chips all may be disposed on a substrate or a circuit board of the laser projector 10.

The microprocessor 35 is coupled to the first drive circuit 31 and the infrared camera 20. The microprocessor 35 may be a processing chip. The microprocessor 35 may be coupled to the first drive circuit 31 through a Pulse Width Modulation (PWM) interface 352. The microprocessor 35 may be coupled to the infrared camera 20 through an Inter-Integrated Circuit (I2C) bus 70. The microprocessor 35 may provide the infrared camera 20 with clock information for collecting infrared images and laser patterns. The infrared images and laser patterns collected by the infrared camera 20 may be sent to the microprocessor 35 through a Mobile Industry Processor Interface (MIPI) 351.

The application processor 33 may server as a system of the mobile terminal 100. The application processor 33 is coupled to the microprocessor 35 and the second drive circuit 32. The application processor 33 may also be coupled to the infrared camera 20 and a visible light camera 50. The microprocessor 35 is coupled to the application processor 33 to enable the application processor 33 to reset the microprocessor 35, wake up the microprocessor 35, debug the microprocessor 35, etc. The microprocessor 35 may be coupled to the application processor 33 through the MIPI 351. In detail, the microprocessor 35 is coupled to a Trusted Execution Environment (TEE) 331 of the application processor 33 through the MIPI 351, to transfer data in the microprocessor 35 directly to the TEE 331. The code and the memory area in the TEE 331 are both controlled by an access control unit and cannot be accessed by the program in the Rich Execution Environment (REE) 332. The TEE 331 and the REE 332 may all be formed in the application processor 33.

In an embodiment, an infrared template and a depth template for verifying an identity may be stored in the TEE 331. The infrared template may be a face infrared image input by the user in advance. The depth template may be a face depth image input by the user in advance. The infrared template and the depth template are stored in the TEE 331, which are not easily falsified and stolen, such that the information in the mobile terminal 100 is relatively secure.

When the user needs to verify the identity, the microprocessor 35 controls the infrared camera 20 to collect an infrared image of the user, and sends the collected infrared image to the TEE 331 of the application processor 33. The collected infrared image is compared with the infrared template in the TEE 331 by the application processor 33. If the two matches, a result that the verification based on the infrared template passes is output. In the process of matching whether the infrared image and the infrared template, the infrared image and the infrared template cannot be obtained, falsified or stolen by other programs, thereby improving the information security of the mobile terminal 100.

Further, the microprocessor 35 may control the first drive circuit 31 to drive the laser projector 10 to project laser light outward, and control the infrared camera 20 to collect the laser pattern modulated by the target object. The microprocessor 35 obtains and processes the laser pattern to get a depth image. The depth image is sent to the TEE 331 of the application processor 33. The application processor 33 compares the depth image with the depth template in the TEE 331. If the two matches, a result that the verification based on the depth template passes is output. In the process of matching whether the depth image and the depth template, the depth image and the depth template cannot be obtained, falsified or stolen by other programs, thereby improving the information security of the mobile terminal 100.

The application processor 33 may also be coupled to a plurality of electronic components of the mobile terminal 100 and control the plurality of electronic components to operate in predetermined modes. For example, a display screen of the mobile terminal 100 is controlled to display predetermined frames, an antenna of the mobile terminal 100 is controlled to transmit or receive predetermined data, the visible light camera 50 of the mobile terminal 100 is controlled to obtain a color image and to process the color image, the power of the infrared camera 20 is controlled to power on or off, the infrared camera 20 is controlled to power down or to reset, and the like.

When the microprocessor 35 is malfunctioning, for example, when the microprocessor 35 is down, the first drive circuit 31 may be in a state of continuously driving the laser projector 10 to emit laser light outward, and the laser light emitted continuously outward has the higher danger. Therefore, it is necessary to monitor an operating state of the microprocessor 35.

In an embodiment, the system 30 may read the preset signal from the microprocessor 35 through the application processor 33 to determine the operating state of the microprocessor 35.

In an embodiment, the system 30 may periodically read the preset signal from the microprocessor 35 through the application processor 33 to determine the operating state of the microprocessor 35. The period of reading the preset signal from the microprocessor 35 through the application processor 33 may be from 1 millisecond to 100 milliseconds. For example, the period of reading the preset signal from the microprocessor 35 through the application processor 33 may be 1 millisecond, 5 milliseconds, 10 milliseconds, 15 milliseconds, 20 milliseconds. 25 milliseconds, 30 milliseconds, 40 milliseconds, 50 milliseconds, 60 milliseconds, 70 milliseconds, 80 milliseconds, 90 milliseconds, or 100 milliseconds.

Furthermore, the application processor 33 is configured to, read the preset signal from the microprocessor periodically, and power off the second drive circuit to power off the first drive circuit and the laser projector, and/or send the reset signal for restarting the microprocessor to the microprocessor, in response to that the application processor cannot read the preset signal continuously for a plurality of times.

The preset signal includes a flag signal of the microprocessor 35, and a flag signal of the infrared camera 20 and read by the microprocessor 35. The flag signal of the microprocessor 35 includes a series of processor-related information, such as a type, a model, manufacturer information, trademark information, a serial number, and cache of the microprocessor 35. The flag signal of the infrared camera 20 includes a series of camera-related information, such as a type, a model, manufacturer information, trademark information, a serial number, and cache of the infrared camera 20. In other embodiments, the application processor 33 may read the preset signal from the microprocessor 35 only when the laser projector 10 is needed. The case where the laser projector 10 is needed includes the user using the laser projector 10 to perform 3D face recognition.

When the application processor 33 cannot read (or continuously cannot read for a plurality of times) the preset signal from the microprocessor 35, it indicates that the microprocessor 35 is in a down state. That is, the microprocessor 35 is malfunctioning. When the application processor 33 can read (or continuously cannot read for a plurality of times) the preset signal from the microprocessor 35, it indicates that the microprocessor 35 is in a normal state. That is, the microprocessor 35 may operate normally.

In an embodiment, the number of the plurality of times may be set in advance, which is not limited here.

It should be understood that, when the application processor 33 cannot continuously read the preset signal for a plurality of times from the microprocessor 35, it indicates that the microprocessor 35 is in the down state (i.e., the microprocessor 35 is malfunctioning). Under this case, there may be various ways of controlling the laser projector 10 when the microprocessor 35 is malfunctioning, which may refer to the embodiments described above, and be not repeated here.

Figure 3:
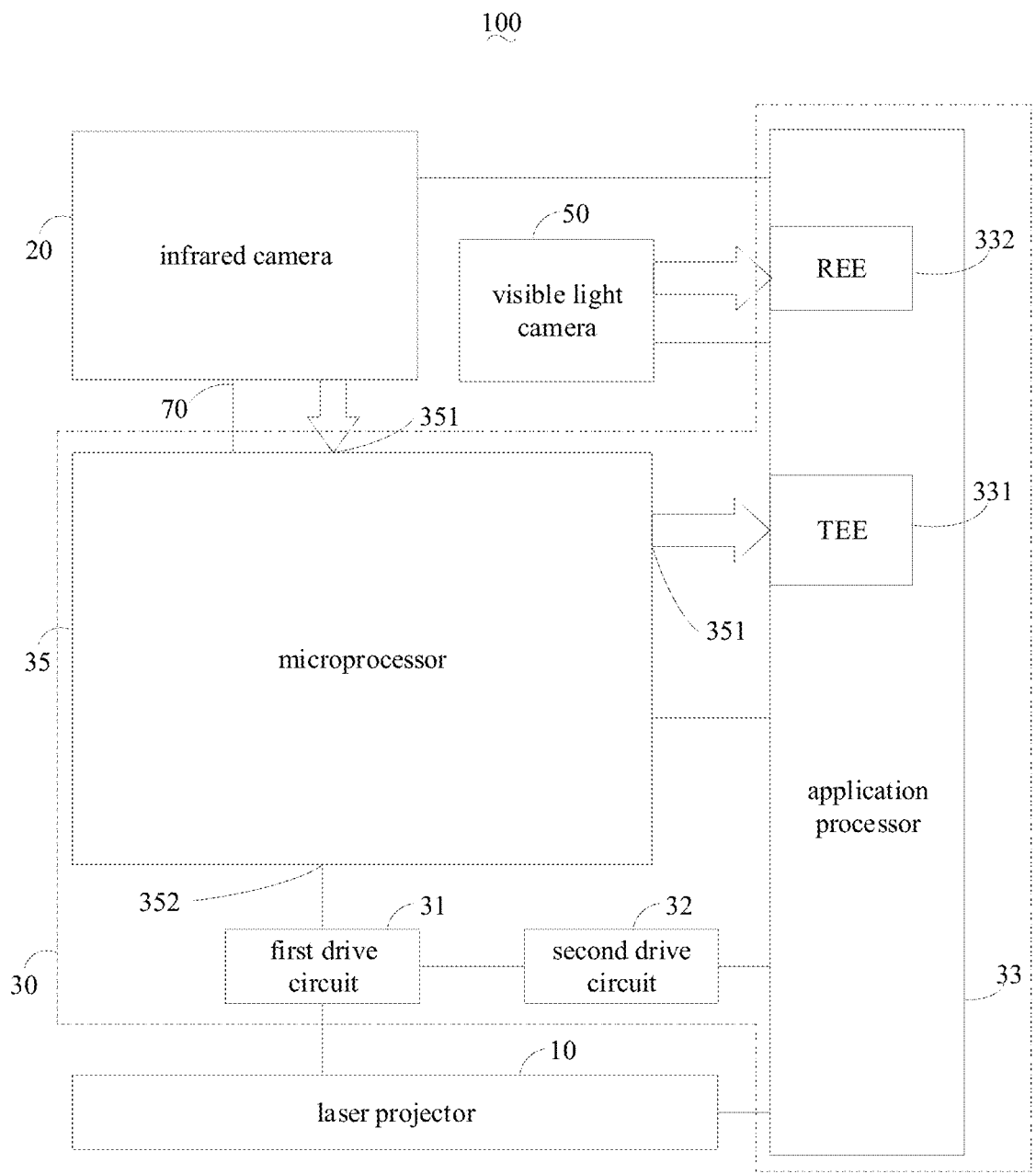
FIG. 3 illustrates a block diagram of a mobile terminal according to some embodiments of the present disclosure.

Referring to FIG. 3, in some embodiments, the application processor 33 periodically reads the preset signal from the microprocessor 35. The application processor 33 is configured to detect whether the laser projector 10 is powered on (whether the laser projector 10 is in a state of emitting laser light) in response to that the application processor 33 cannot read the preset signal continuously for a plurality of times. The application processor 33 is configured to power off the second drive circuit 32 to power off the first drive circuit 31 and the laser projector 10, and to send the reset signal for restarting the microprocessor 35, in response to that the laser projector 10 is powered on. The application processor 33 is configured to send the reset signal for restarting the microprocessor 35 in response to that the laser projector 10 is powered off.

At this time, the laser projector 10 is also directly coupled to the application processor 33 to enable the application processor 33 to detect whether the laser projector 10 is operating (in a state in which laser light is emitted). In detail, the application processor 33 may determine whether the laser projector 10 is operating by detecting a flag signal of the laser projector 10. The flag signal of the laser projector 10 includes information related to the laser projector, such as a type, a model, manufacturer information, trademark information, a serial number, and cache of the laser projector 10. When the application processor 33 detects the flag signal of the laser projector 10, the laser projector 10 is in an operating state; when the application processor 33 does not detect the flag signal of the laser projector 10, the laser projector 10 is in the down state.

The system 30 provided in the present embodiment first powers off the laser projector 10 and then restarts the microprocessor 35 when the microprocessor 35 is malfunctioning and the laser projector 10 is powered on, to prevent the laser projector 10 from being a state of emitting laser light for a long period of time, thereby preventing the laser projector 10 from continuously emitting laser light outward to damage the user.

In some embodiments, the application processor 33 is configured to, after sending the reset signal for restarting the microprocessor 35 to the microprocessor 35, read the preset signal from the microprocessor 35, and power off the second drive circuit 32 to power off the first drive circuit 31 and the laser projector 10 in response to that the application processor 33 cannot read the preset signal.

In detail, after the application processor 33 sends the reset signal for restarting the microprocessor 35 to the microprocessor 35, the application processor 33 cannot read the preset signal from the microprocessor 35, it indicates that the microprocessor 35 may be damaged. At this time, the microprocessor 35 cannot be restarted to make it operate normally.

With the system 30 provided in the present embodiment, after the application processor 33 sends the reset signal for restarting the microprocessor 35 to the microprocessor 35, the application processor 33 cannot read the preset signal from the microprocessor 35, the application processor 33 powers off the second drive circuit 32 to power off the first drive circuit 31 and the laser projector 10, thereby preventing the laser projector 10 from continuously emitting laser light outward to damage the user.

Figure 4:
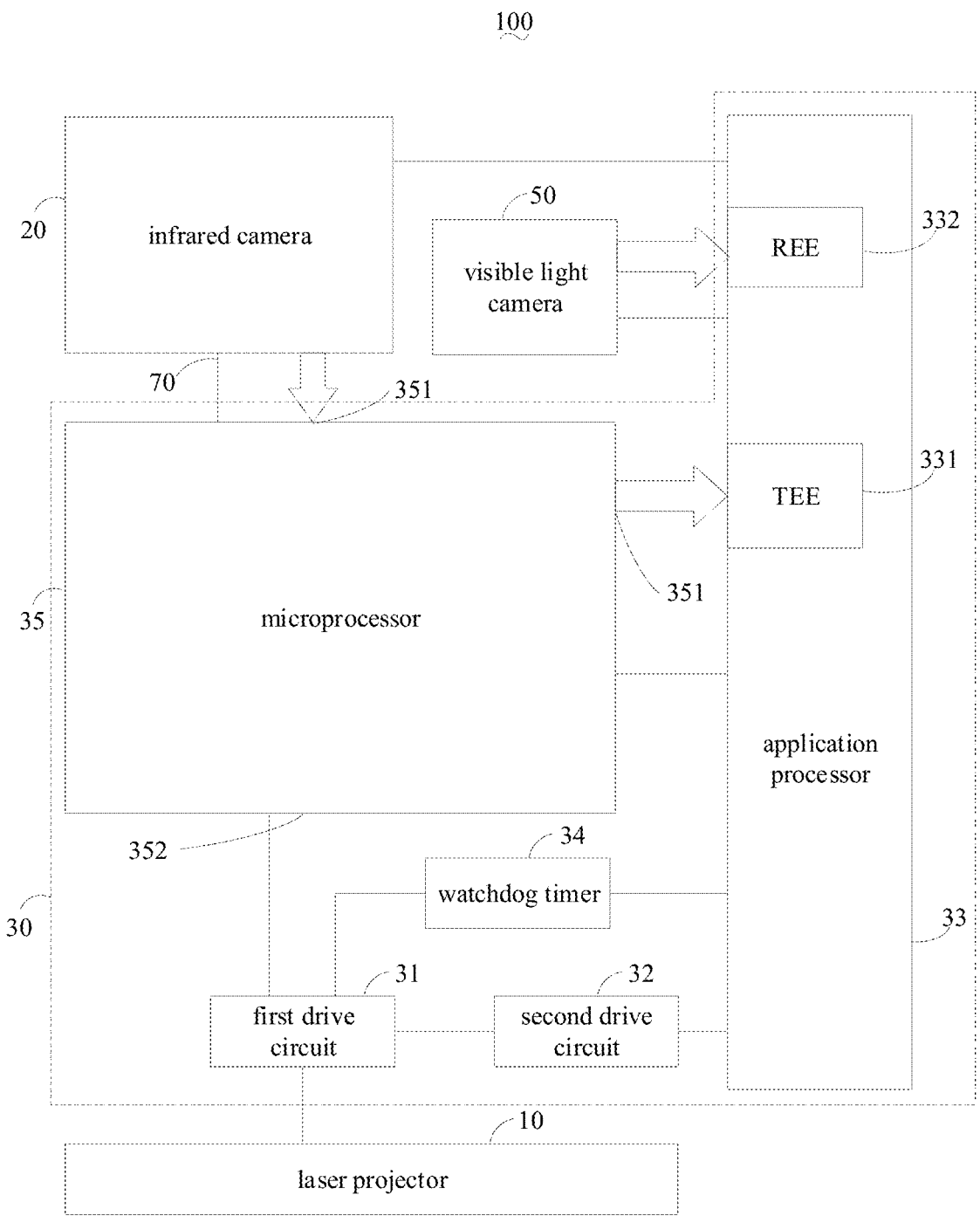
FIG. 4 illustrates a block diagram of a mobile terminal according to some embodiments of the present disclosure.

Referring to FIG. 4, in some embodiments, the system 30 further includes a watchdog timer 34 coupled to the first drive circuit 31 and the application processor 33. The application processor 33 is further configured to send a predetermined signal to the watchdog timer 34 at a predetermined time interval. The watchdog timer 34 is configured to, receive the predetermined signal, and power off the first drive circuit 31 to power off the laser projector 10 in response to that the predetermined signal is not received during a predetermined duration.

The predetermined signal may include a signal indicating an operating state of the application processor 33. At this time, the watchdog timer 34 may determine whether the application processor 33 has an operation failure according to the predetermined signal. The predetermined signal may further include a signal controlling the first drive circuit 31 and the laser projector 10 to operate. For example, the watchdog timer 34 may control the intensity, time, and the like of the laser light emitted from the laser projector 10 in accordance with the predetermined signal. Since the application processor 33 is in an operation failure state, for example, when the application processor 33 is down, if the first drive circuit 31 may be in a state of continuously driving the laser projector 10 to emit laser light, the laser projector 10 may emit laser light to damage the user. Therefore, it is necessary to monitor the operating state of the application processor 33. When the application processor 33 is malfunctioning, the laser projector 10 is powered off in time. In the embodiment of the present disclosure, the watchdog timer 34 may power off the laser projector 10 by powering off the first drive circuit 31. The system 30 provided in the present embodiment may send the predetermined signal to the watchdog timer 34 through the application processor 33 at a predetermined time interval, for example, send a clear signal (predetermined signal) to the watchdog timer 34 every 50 milliseconds. When the application processor 33 has the operation failure, the application processor 33 cannot run the program for sending the predetermined signal to the watchdog timer 34, such that the predetermined signal cannot be sent to make the failure state of the application processor 33 to be detected.

Referring to FIG. 4 continuously, the watchdog timer 34 is configured to power off the first drive circuit 31 to power off the laser projector 10 when the predetermined signal is not received within the predetermined duration. The predetermined duration may be set when the mobile terminal 100 leaves factory, or may be customized according to the user of the mobile terminal 100.

In detail, in some embodiments of the present disclosure, a specific form of the watchdog timer 34 may be a counter. After the watchdog timer 34 receives the predetermined signal, the watchdog timer 34 starts counting down from a number at a certain speed. If the application processor 33 is operating normally, the application processor 33 will resend the predetermined signal before the number is counted down to 0. The watchdog timer 34 resets the number for counting down again after receiving the predetermined signal. If the application processor 33 is not operating normally, the watchdog timer 34 count down the number to 0, and is deemed to determine that the application processor 33 is malfunctioning. At the same time, the watchdog timer 34 sends the signal to power off the first drive circuit 31 to power off the laser projector 10.

In one example, the watchdog timer 34 may be external to the application processor 33. The watchdog timer 34 may be an external timer chip. The watchdog timer 34 may be coupled to an I/O of the application processor 33 to receive the predetermined signal from the application processor 33. The reliability of the external watchdog timer 34 is high. In another example, the watchdog timer 34 may be integrated within the application processor 33, and the functionality of the watchdog timer 34 may be implemented by an internal timer of the application processor 33, which simplifies a hardware circuit design of the system 30.

Referring to FIG. 4, in some embodiments, the system 30 further includes a watchdog timer 34 coupled to the first drive circuit 31 and the application processor 33. The application processor 33 is further configured to send a predetermined signal to the watchdog timer 34 at a predetermined time interval. The watchdog timer 34 is configured to, receive the predetermined signal from the application processor 33 and send the reset signal for restarting the application processor 33 in response to that the predetermined signal is not received during a predetermined duration. As described above, when the watchdog timer 34 does not receive the predetermined signal within the predetermined duration, the application processor 33 is malfunctioning. At this time the watchdog timer 34 sends the reset signal to cause the application processor 33 to reset and operate normally.

In detail, in one example, the reset signal may be directly received by the application processor 33. The reset signal has a higher level in the execution program of the application processor 33. The application processor 33 may preferentially respond to the reset signal. In another example, the reset signal may also be sent to a reset chip external to the application processor 33. The reset chip responds to the reset signal to force the application processor 33 to reset.

Referring to FIG. 4, in some embodiments, the system 30 further includes a watchdog timer 34 coupled to the first drive circuit 31 and the application processor 33. The application processor 33 is further configured to send a predetermined signal to the watchdog timer 34 at a predetermined time interval. The watchdog timer 34 is configured to, receive the predetermined signal from the application processor 33, power off the first drive circuit 31 to power off the laser projector 10 and send the reset signal for restarting the application processor 33 in response to that the predetermined signal is not received during a predetermined duration.

As described above, when the watchdog timer 34 does not receive the predetermined signal within the predetermined duration, the application processor 33 is malfunctioning. At this time the watchdog timer 34 may first power off the first drive circuit 31 to power off the laser projector 10, and then send the reset signal to cause the application processor 33 to reset and operate normally.

Figure 5:
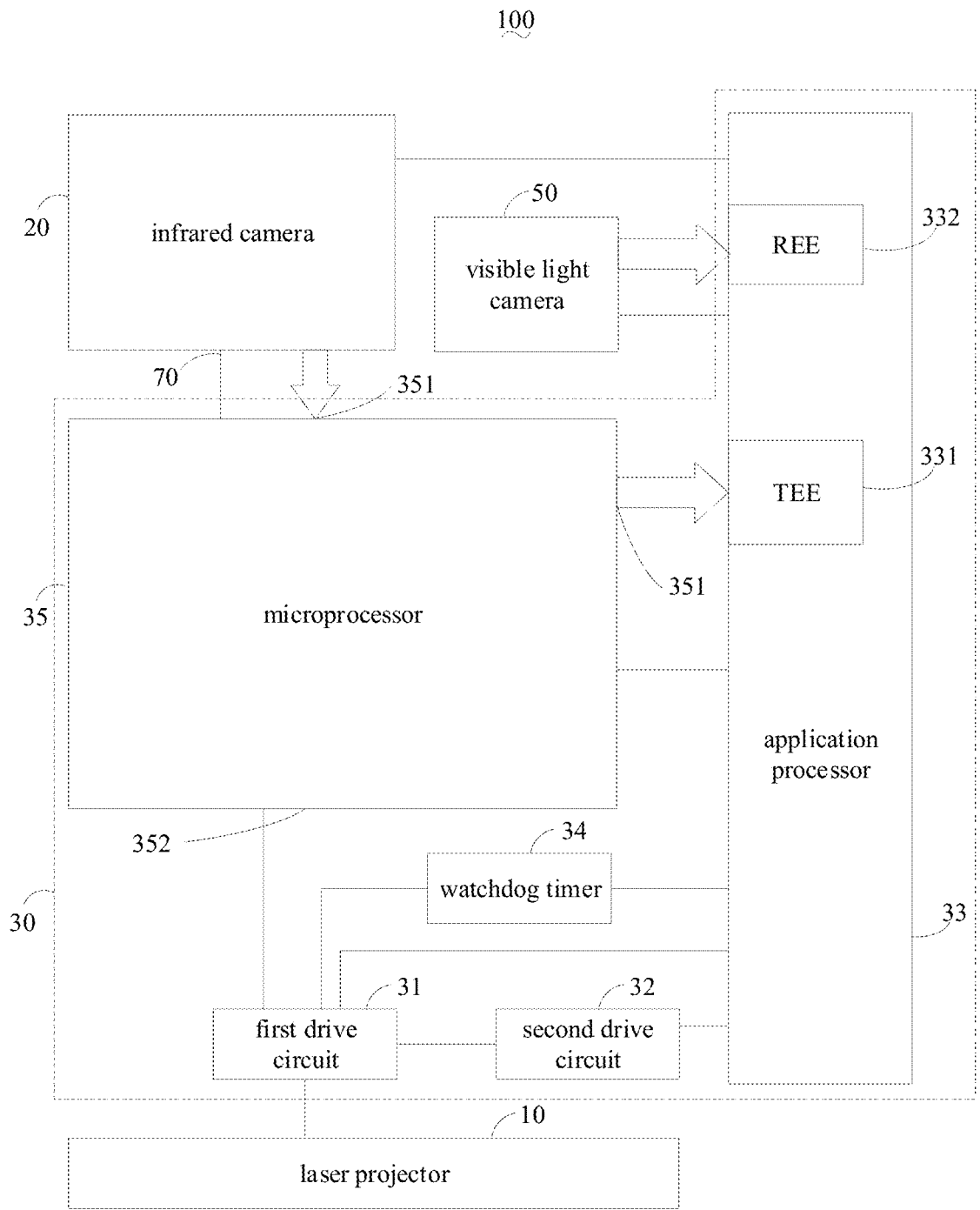
FIG. 5 illustrates a block diagram of a mobile terminal according to some embodiments of the present disclosure.

Referring to FIG. 5, in some embodiments, the system 30 further includes a watchdog timer 34 coupled to the first drive circuit 31 and the application processor 33. The application processor 33 is further configured to send a predetermined signal to the watchdog timer 34 at a predetermined time interval. The watchdog timer 34 is configured to, receive the predetermined signal from the application processor 33. The first drive circuit 31 is further configured to send a timeout signal to the application processor 33 (at this time, the application processor 33 is also directly coupled to the first drive circuit 31) in response to that a duration of outputting the electrical signal is greater than or equal to a predetermined threshold. The application processor 33 is configured to stop sending the predetermined signal to the watchdog timer 34 upon receiving the timeout signal. The watchdog timer 34 is also configured to power off the first drive circuit 31 to power off the laser projector 10 when the predetermined signal is not received within the predetermined duration.

Figure 6:
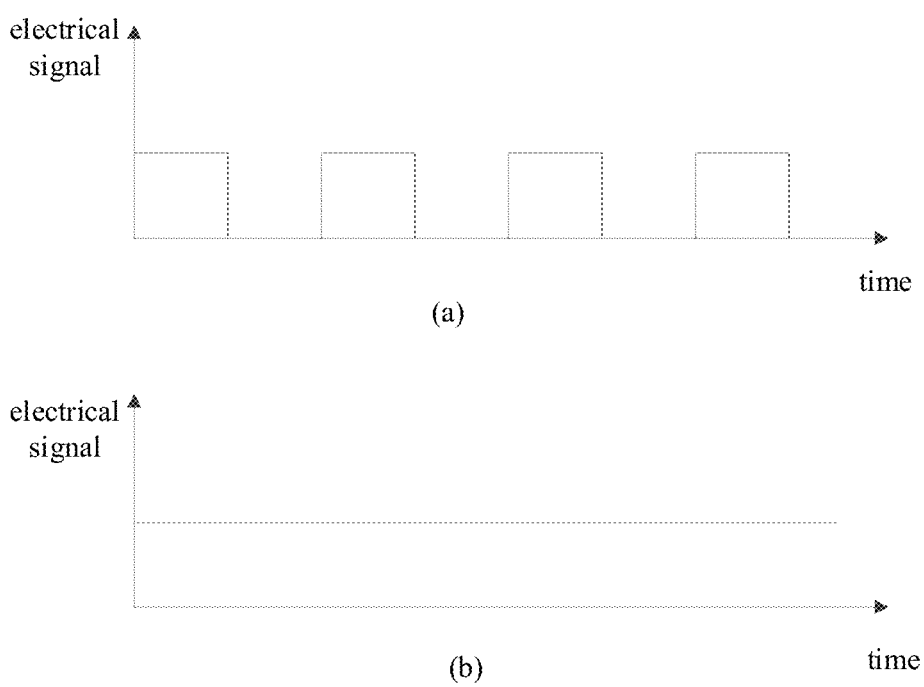
FIG. 6 illustrates a schematic diagram of a pulse wave signal output by a first drive circuit according to some embodiments of the present disclosure.

Referring to FIG. 6(a), when the first drive circuit 31 operates normally, the first drive circuit 31 outputs a pulse wave signal (for example, a square wave signal), such that the laser projector 10 continuously emits a plurality of frames of laser light. Referring to FIG. 6(b), when the first drive circuit 31 is malfunctioning, the first drive circuit 31 will keep outputting a high-level signal, such that the laser projector 10 continuously emits laser light outward. In order to prevent the laser projector 10 from continuously emitting laser light outward to damage the user, in the embodiment of the present disclosure, the laser projector 10 may be powered off by powering off the first drive circuit 31.

In detail, the first drive circuit 31 may be integrated with a timing function. The first drive circuit 31 may detect itself whether a duration of outputting the electrical signal is greater than or equal to a predetermined threshold. When the duration of outputting the electrical signal by the first drive circuit 31 is greater than or equal to the predetermined threshold, the first drive circuit 31 stops outputting the electrical signal to power off the laser projector 10. The predetermined threshold may be within a range of [3, 10] milliseconds. For example, the predetermined threshold may be set to 3 milliseconds, 4 milliseconds, 5 milliseconds, 6 milliseconds, 7 milliseconds, 8 milliseconds, 9 milliseconds, 10 milliseconds and any milliseconds within the above range.

In detail, when the laser projector 10 continuously emits laser light outward, that is, the duration of outputting the electrical signal by the first drive circuit 31 is greater than or equal to the predetermined threshold, the first drive circuit 31 may send the timeout signal to the application processor 33. When the application processor 33 receives the timeout signal from the first drive circuit 31, the application processor 33 stops sending the predetermined signal to the watchdog timer 34. The watchdog timer 34 is coupled to the first drive circuit 31. The watchdog timer 34 is coupled to the application processor 33. The watchdog timer 34 is configured to power off the first drive circuit 31 to power off the laser projector 10 when the predetermined signal is not received within the predetermined duration. The predetermined duration may be set when the mobile terminal 100 leaves factory, or may be customized according to the user of the mobile terminal 100.

In the embodiment, the specific form of the watchdog timer 34 may be a counter. After the watchdog timer 34 receives the predetermined signal, the watchdog timer 34 starts counting down at a certain speed from a number. If the first drive circuit 31 normally outputs the pulse wave signal, the application processor 33 resends the predetermined signal before the number is counted down to reach 0, and the watchdog timer 34 resets the number after receiving the predetermined signal. If the duration of outputting the electrical signal by the first drive circuit 31 is greater than or equal to the predetermined threshold, and the watchdog timer 34 counts to 0, the application processor 33 does not send the predetermined signal, and the watchdog timer 34 is deemed to determine that the first drive circuit 31 is malfunctioning. A signal is sent by the watchdog timer 34 to power off the first drive circuit 31 to power off the laser projector 10.

In some embodiments, the predetermined duration of the above embodiment is within a range of [50, 150] milliseconds. In detail, the predetermined duration may be set to 50 milliseconds, 62 milliseconds, 75 milliseconds, 97 milliseconds, 125 milliseconds, 150 milliseconds and any duration within the above range. It should be understood that if the predetermined duration is set too short, the application processor 33 is required to send the predetermined signal too frequently, which may occupy too much processing space of the application processor 33 and cause the mobile terminal 100 to jam easily. If the predetermined duration is set too long, the failure of the application processor 33 cannot be detected in time, that is, the laser projector 10 cannot be powered off in time, which is disadvantageous for the safe use of the laser projector 10. By setting the predetermined duration within a range of [50, 150] milliseconds, it is possible to better balance the fluency and security of the mobile terminal 100.

Figure 7:
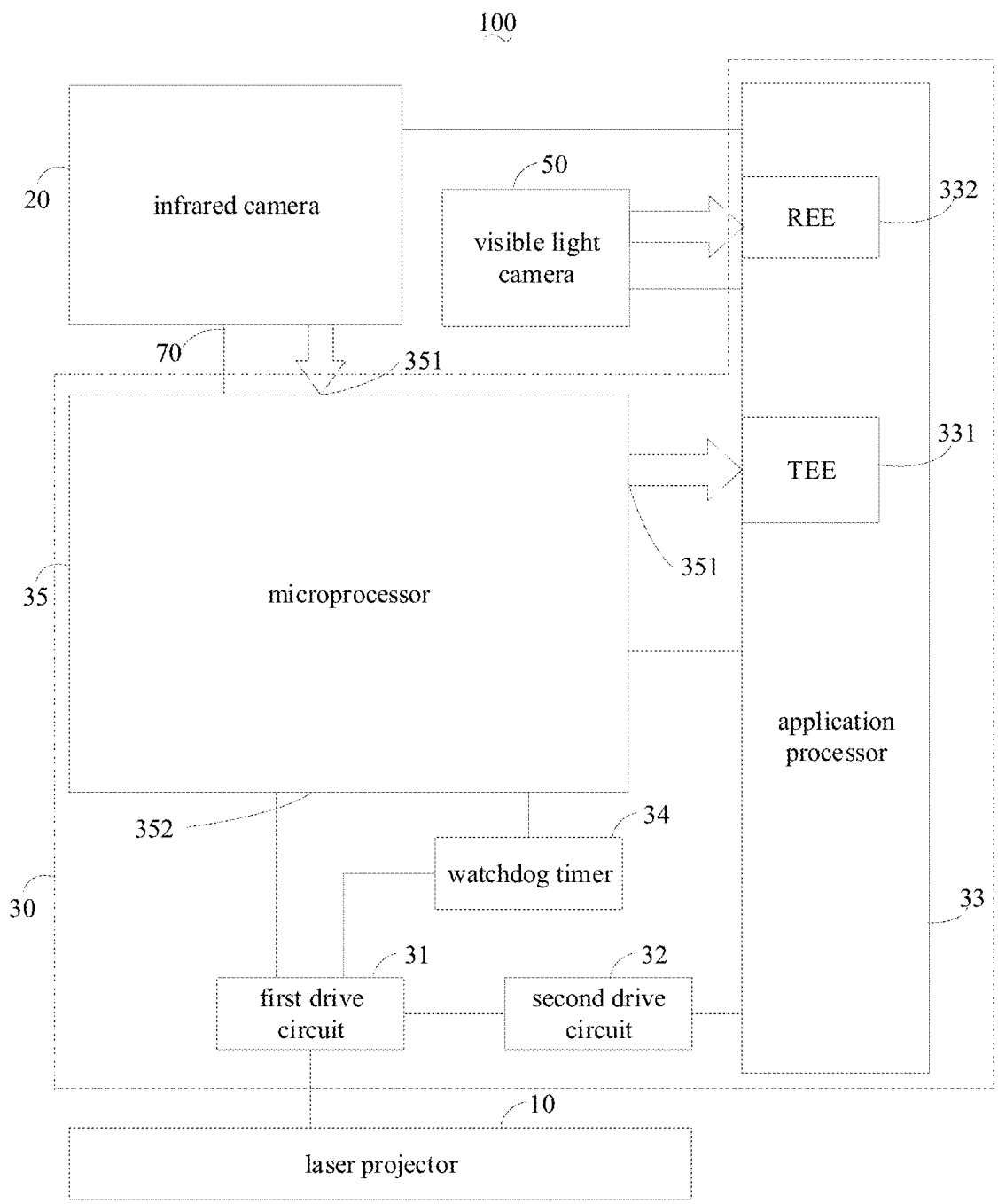
FIG. 7 illustrates a block diagram of a mobile terminal according to some embodiments of the present disclosure.

Referring to FIG. 7, in some embodiments, the system 30 further includes a watchdog timer 34 coupled to the first drive circuit 31 and the microprocessor 33. The microprocessor 33 is configured to send a predetermined signal to the watchdog timer 34 at a predetermined time interval. For example, the microprocessor 35 may send a clear signal (the predetermined signal) to the watchdog timer 34 every 50 milliseconds. The watchdog timer 34 is configured to receive the predetermined signal from the microprocessor 35 and power off the first drive circuit 31 to power off the laser projector 10 in response to that the predetermined signal is not received during a predetermined duration.

The predetermined signal may include a signal indicating an operating state of the microprocessor 35. At this time, the watchdog timer 34 may determine whether the microprocessor 35 has an operation failure according to the predetermined signal. The predetermined signal may further include a signal for controlling the first drive circuit 31 and the laser projector 10 to operate. For example, the watchdog timer 34 may control the intensity, time, and the like of the laser light emitted by the laser projector 10 in accordance with the predetermined signal. When the laser projector 10 continues to emit laser light outward, that is, the duration of outputting the electrical signal by the first drive circuit 31 is greater than or equal to a predetermined threshold, the first drive circuit 31 sends a timeout signal to the microprocessor 35. When the microprocessor 35 receives the timeout signal from the first drive circuit 31, the microprocessor 35 stops sending the predetermined signal. The watchdog timer 34 is coupled to the first drive circuit 31. The watchdog timer 34 is coupled to the microprocessor 35. The watchdog timer 34 is configured to power off the first drive circuit 31 to power off the laser projector 10 when the predetermined signal is not received within the predetermined duration. The first drive circuit 31 stops outputting the electrical signal to the laser projector 10 to power off the laser projector 10. The predetermined duration may be set when the mobile terminal 100 leaves factory, or may be customized according to the user of the mobile terminal 100.

In the embodiment of the present disclosure, the specific form of the watchdog timer 34 may be a counter. After the watchdog timer 34 receives the predetermined signal, the watchdog timer 34 starts counting down at a certain speed from a number. If the first drive circuit 31 normally outputs the pulse wave signal, the microprocessor 35 resend the predetermined signal before the number is counted down to reach 0, the watchdog timer 34 resets the number upon receiving the predetermined signal. If the duration of outputting the electrical signal by the first drive circuit 31 is greater than or equal to a predetermined threshold, and the watchdog timer 34 count the number down to 0, the microprocessor 35 does not send the predetermined signal, the watchdog timer 34 determined that the first drive circuit 31 is malfunctioning. A signal is sent by the watchdog timer 34 to power off the first drive circuit 31 to power off the laser projector 10.

In one example, the watchdog timer 34 may be external to the microprocessor 35. The watchdog timer 34 may be an external timer chip. The watchdog timer 34 may be coupled to an I/O of the microprocessor 35 to receive the predetermined signal from the microprocessor 35. The reliability of the external watchdog timer 34 is high. In another example, the watchdog timer 34 may be integrated into the microprocessor 35. The function of the watchdog timer 34 may be implemented by an internal timer of the microprocessor 35, which simplifies a hardware circuit design of the system 30.

Referring to FIG. 7, in some embodiments, the system 30 further includes a watchdog timer 34 coupled to the first drive circuit 31 and the microprocessor 33. The microprocessor 33 is configured to send a predetermined signal to the watchdog timer 34 at a predetermined time interval. The watchdog timer 34 is configured to receive the predetermined signal from the microprocessor 35. The first drive circuit 31 is configured to send a timeout signal to the microprocessor 35 in response to that a duration of outputting the electrical signal is greater than or equal to a predetermined threshold. The microprocessor 35 is configured to stop sending the predetermined signal to the watchdog timer 34 upon receiving the timeout signal. The watchdog timer 34 is configured to power off the laser projector 10 in response to that the predetermined signal is not received during a predetermined duration.

In detail, when the laser projector 10 continuously emits laser light outward, that is, the duration of outputting the electrical signal by the first drive circuit 31 is greater than or equal to the predetermined threshold, the first drive circuit 31 may send the timeout signal to the microprocessor 35. When the microprocessor 35 receives the timeout signal from the first drive circuit 31, the microprocessor 35 stops sending the predetermined signal to the watchdog timer 34. The watchdog timer 34 is coupled to the first drive circuit 31. The watchdog timer 34 is coupled to the microprocessor 35. The watchdog timer 34 is configured to power off the first drive circuit 31 to power off the laser projector 10 when the predetermined signal is not received within the predetermined duration.

In the embodiment, the specific form of the watchdog timer 34 may be a counter. After the watchdog timer 34 receives the predetermined signal, the watchdog timer 34 starts counting down at a certain speed from a number. If the first drive circuit 31 normally outputs the pulse wave signal, the microprocessor 35 resends the predetermined signal before the number is counted down to reach 0, and the watchdog timer 34 resets the number after receiving the predetermined signal. If the duration of outputting the electrical signal by the first drive circuit 31 is greater than or equal to the predetermined threshold, and the watchdog timer 34 counts to 0, the microprocessor 35 does not send the predetermined signal, and the watchdog timer 34 is deemed to determine that the first drive circuit 31 is malfunctioning. A signal is sent by the watchdog timer 34 to power off the first drive circuit 31 to power off the laser projector 10.

In some embodiments, the predetermined duration of the above embodiment is within a range of [50, 150] milliseconds. In detail, the predetermined duration may be set to 50 milliseconds, 62 milliseconds, 75 milliseconds, 97 milliseconds, 125 milliseconds, 150 milliseconds and any duration within the above range. It should be understood that if the predetermined duration is set too short, the microprocessor 35 is required to send the predetermined signal too frequently, which may occupy too much processing space of the microprocessor 35 and cause the mobile terminal 100 to jam easily. If the predetermined duration is set too long, the failure of the microprocessor 35 cannot be detected in time, that is, the laser projector 10 cannot be powered off in time, which is disadvantageous for the safe use of the laser projector 10. By setting the predetermined duration within a range of [50, 150] milliseconds, it is possible to better balance the fluency and security of the mobile terminal 100.

Figure 8:
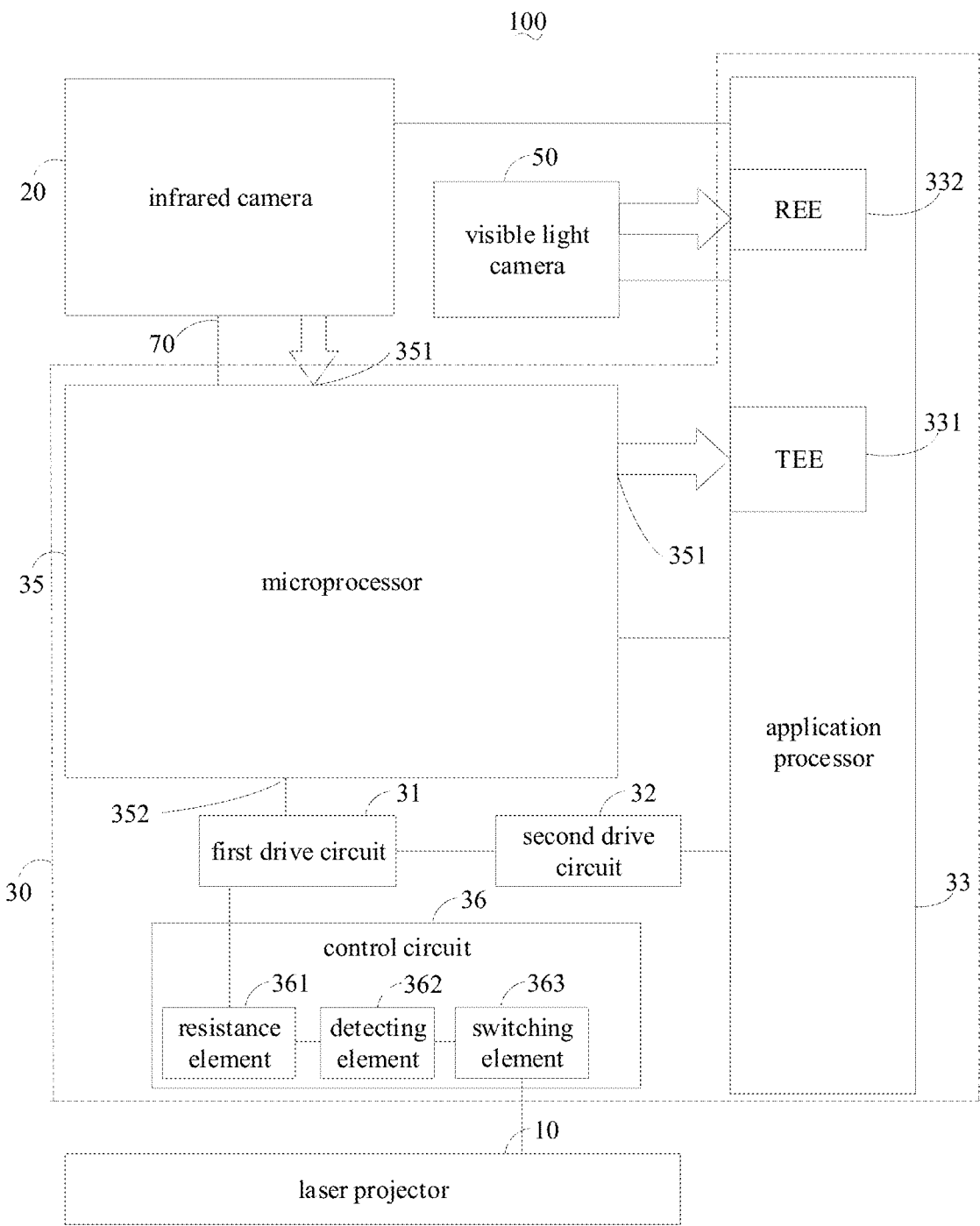
FIG. 8 illustrates a block diagram of a mobile terminal according to some embodiments of the present disclosure.

Referring to FIG. 8, in some embodiments, the system 30 further includes a control circuit 36. The control circuit 36 is coupled to the first drive circuit 31 and the laser projector 10. The control circuit 36 includes a resistance element 361, a detecting element 362 and a switching element 363. The detecting element 362 may be an ammeter. The detecting element 362 is coupled with the resistance element 361 and the first drive circuit 31 in series. The detecting element 362 is configured to detect a current flowing through the resistance element 361. The switching element 363 is coupled to the laser projector 10. The switching element 363 is configured to switch off the laser projector 10 when the current flowing through the resistance element 361 is greater than a preset current value.

In one example, when the first drive circuit 31 outputs an electrical signal to drive the laser projector 10 to project each frame of laser light, and the current output by the first drive circuit 31 is sequentially increased. For example, the current output by the first drive circuit 31 is increased from 100 mA to 200 mA. When the first drive circuit 31 is malfunctioning, the first drive circuit 31 keeps outputting a high-level signal, and the current may be increased continuously after increasing from 100 mA to 200 mA. At this time, the preset current value may be set to 220 mA. Since the resistance element 361 is coupled in series with the first drive circuit 31, the current flowing through the first drive circuit 31 is the current flowing through the resistance element 361. The switching element 363 is switched off when the current flowing through the resistance element 361 is greater than 220 mA to power off the laser projector 10.

Of course, in other embodiments, the detecting element 362 may be a voltmeter. The detecting element 362 may be coupled to the resistance element 361 in parallel. The detecting element 362 is configured to detect a voltage across the resistance element 361. The switching element 363 is switched off to power off the laser projector 10 when the voltage across the resistance element 361 is greater than a preset voltage value, which is not described in detail here.

Figure 9:
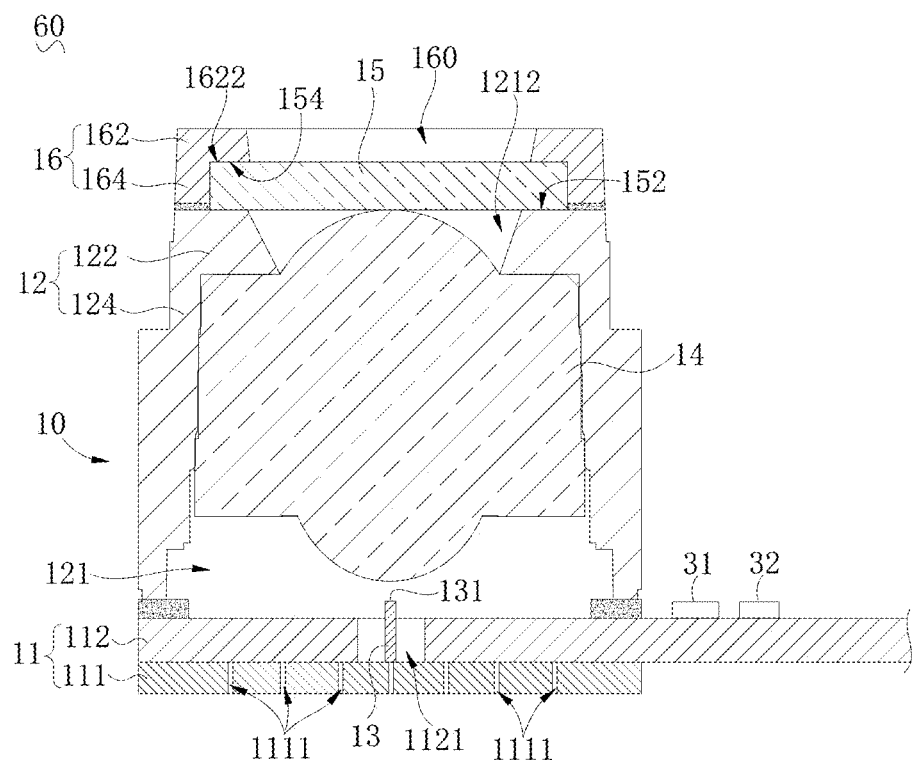
FIG. 9 illustrates a structure view of a laser projection assembly according to some embodiments of the present disclosure.

Referring to FIG. 9, in some embodiments, a laser projection assembly 60 is provided. The laser projection assembly 60 includes a laser projector 10, a first drive circuit 31, and a second drive circuit 32. The first drive circuit 31 and the second drive circuit 32 both may be integrated into a substrate assembly 11 of the laser projector 10.

Referring to FIG. 9, in some embodiments, the laser projector 10 includes a substrate assembly 11, a lens barrel 12, a light source 13, a collimating element 14, a diffractive optical element (DOE) 15, and a protective cover 16.

The substrate assembly 11 includes a substrate 111 and a circuit board 112. The circuit board 112 is disposed on the substrate 111. The circuit board 112 is configured to couple the e light source 13 and a main board of the mobile terminal 100. The circuit board 112 may be a hard board, a soft board or a soft and hard board. In the embodiment illustrated in FIG. 9, a through hole 1121 is formed in the circuit board 112. The light source 13 is fixed on the substrate 111 and electrically coupled to the circuit board 112. A heat dissipation hole 1111 may be formed on the substrate 111. The heat generated by the operation of the light source 13 or the circuit board 112 may be dissipated by the heat dissipation hole 1111. The heat dissipation hole 111 may be filled with a thermal adhesive, to further improve the heat dissipation performance of the substrate assembly 11.

The lens barrel 12 is fixedly coupled to the substrate assembly 11. The lens barrel 12 is formed with an accommodating cavity 121. The lens barrel 12 includes a top wall 122 and an annular peripheral wall 124 extending from the top wall 122. The peripheral wall 124 is disposed on the substrate assembly 11. The top wall 122 defines a light-passing hole 1212 communicating with the accommodating cavity 121. The peripheral wall 124 may be coupled to the circuit board 112 by glue.

The protective cover 16 is disposed on the top wall 122. The protective cover 16 includes a baffle 162 having a light-passing hole 160 and an annular side wall 164 extending from the baffle 162.

The light source 13 and the collimating element 14 are both disposed in the accommodating cavity 121. The diffractive optical element 15 is mounted on the lens barrel 12. The collimating element 14 and the diffractive optical element 15 are sequentially disposed on a light-emitting path of the light source 13. The collimating element 14 collimates the laser light emitted by the light source 13, and the laser light passes through the collimating element 14 and then passes through the diffractive optical element 15 to form a laser pattern.

Figure 10:
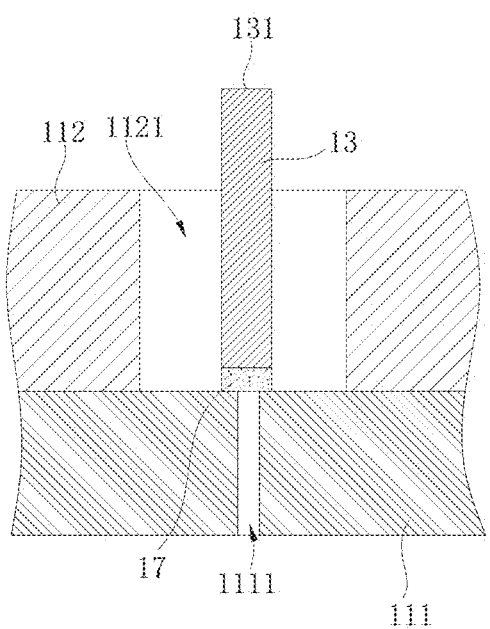
FIGS. 10 to 12 illustrates partial structure views of a laser projector according to some embodiments of the present disclosure.
Figure 11:
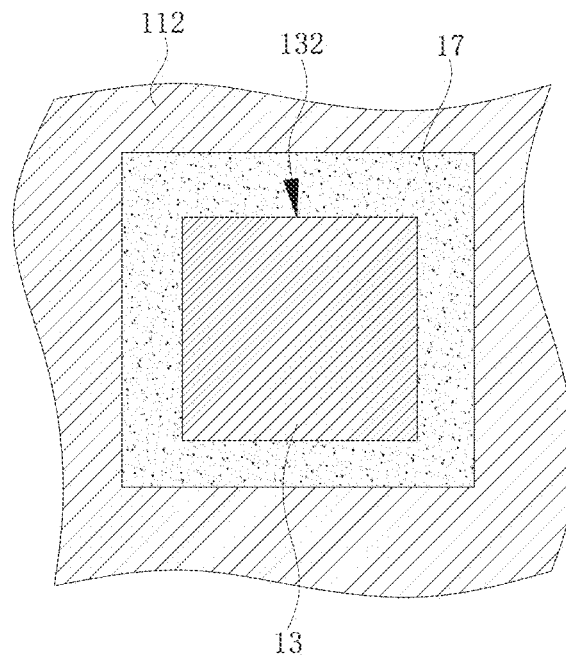

The light source 13 may be a Vertical Cavity Surface Emitting Laser (VCSEL) or an edge-emitting laser (EEL). In the embodiment illustrated in FIG. 9, the light source 13 is an edge-emitting laser. In detail, the light source 13 may be a Distributed Feedback Laser (DFB). The light source 13 is configured to emit laser light into the accommodating cavity 112. Referring to FIG. 10, the light source 13 is a columnar as a whole. One end surface of the light source 13, which is away from the substrate assembly 11, form a light-emitting surface 131. The laser light is emitted from the light-emitting surface 131. The light-emitting surface 131 faces the collimating element 14. The light source 13 is fixed on the substrate assembly 11. In detail, the light source 13 may be adhered to the substrate assembly 11 by a sealant 17. For example, a surface of the light source 13 opposite to the light-emitting surface 131 is attached to the substrate assembly 11. Referring to FIG. 9 and FIG. 11, one or more side surfaces 132 of the light source 13 may also be adhered to the substrate assembly 11. The sealing 17 encloses the surrounding side surfaces 132, or may only attach one side surface 132 to the substrate assembly 11, or a few side surfaces 132 to the substrate assembly 11. At this time, the sealant 17 may be a thermal conductive adhesive to conduct heat generated by the operation of the light source 13 into the substrate assembly 11.

Referring to FIG. 9, the diffractive optical element 15 is carried on the top wall 122 and housed in the protective cover 16. The opposite sides of the diffractive optical element 15 are respectively in contact with the protective cover 16 and the top wall 122. The baffle 162 includes an abutting surface 1622 adjacent to the light-passing hole 1212, and the diffractive optical element 15 is in contact with the abutting surface 1622.

In detail, the diffractive optical element 15 includes a diffraction incident surface 152 and a diffraction exit surface 154 which are opposite. The diffractive optical element 15 is carried on the top wall 122. The diffractive exit surface 154 is in contact with the surface (the abutting surface 1622) of the baffle 162 near the light-passing hole 1212, and the diffractive incident surface 152 is in contact with the top wall 162. The light-passing hole 1212 is aligned with the accommodating cavity 121. The light-emitting through-hole 160 is aligned with the light-passing hole 1212. The top wall 122, the annular side wall 164, and the baffle 162 are in contact with the diffractive optical element 15, thereby preventing the diffractive optical element 15 from falling out of the protective cover 16 in the light emission direction. In some embodiments, the protective cover 16 is adhered to the top wall 162 by glue.

The light source 13 of the laser projector 10 described above employs an edge-emitting laser. On the one hand, the temperature drift of the edge-emitting laser is smaller than that of the VCSEL array. On the other hand, since the edge-emitting laser is a single-point emitting structure, it is not necessary to design an array structure. The manufacturing is simple, and the light source of the laser projector 10 is low in cost.

When the laser light of the distributed feedback laser propagates, the gain of the power is obtained through the feedback of the grating structure. To increase the power of the distributed feedback laser, it is necessary to increase the injecting current and/or increase the length of the distributed feedback laser. Since increasing the injecting current will increase the power consumption of the distributed feedback laser and cause serious heat generation, in order to ensure the normal operation of the distributed feedback laser, it is necessary to increase the length of the distributed feedback laser, thus the distributed feedback laser usually has an elongate strip. When the light-emitting surface 131 of the edge-emitting laser faces the collimating element 14, the edge-emitting laser is placed vertically. Due to the structure of elongate strip of the edge-emitting laser, the edge-emitting laser is prone to accidents such as dropping, shifting or shaking. Therefore, by providing the sealant 17, the edge-emitting laser may be fixed to prevent accidents such as dropping, displacement or shaking of the edge-emitting laser.

Figure 12:
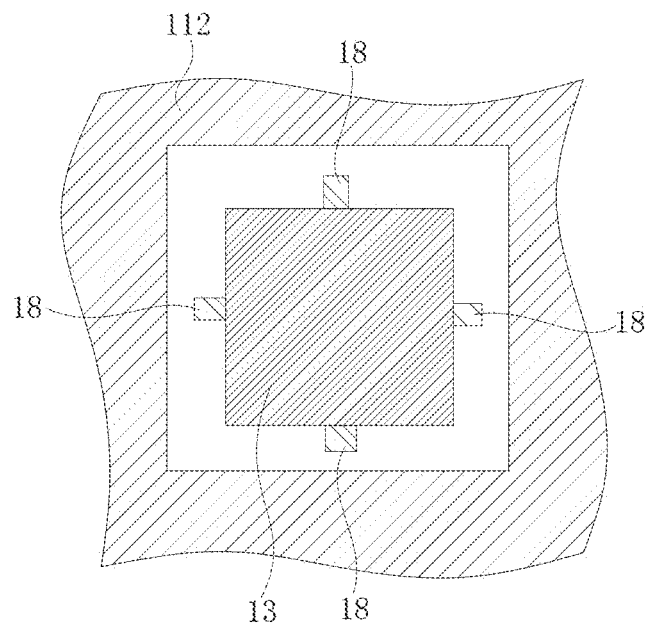

Refer to FIG. 9 and FIG. 12, in some embodiments, the light source 13 may also be fixed to the substrate assembly 11 in a fixed manner as illustrated in FIG. 12. In detail, the laser projector 10 includes a plurality of support members 18. The plurality of support members 18 may be fixed to the substrate assembly 11. The plurality of support members 18 collectively surround the light source 13. The light source 13 may be directly mounted among the plurality of support members 18. In one example, the plurality of support members 18 collectively clamp the light source 13 to further prevent the light source 13 from shaking.

In some embodiments, the protective cover 16 may be omitted. At this time, the diffractive optical element 15 may be disposed in the accommodating cavity 121. The diffraction exit surface 154 of the diffractive optical element 15 may be opposed to the top wall 122, and the laser light passes through the diffractive optical element 15 and then passes through the light-passing hole 1212. Thus, the diffractive optical element 15 is less likely to fall off.

In some embodiments, the substrate 111 may also be omitted. The light source 13 may be directly fixed to the circuit board 112 to reduce the thickness of the laser projector 10.

Reference throughout this specification to "an embodiment," "some embodiments," "one embodiment", "another example," "an example," "a specific example," or "some examples," means that a particular feature, structure, material, or characteristic described in connection with the embodiment or example is included in at least one embodiment or example of the present disclosure. Thus, the appearances of the phrases such as "in some embodiments," "in one embodiment", "in an embodiment", "in another example," "in an example," "in a specific example," or "in some examples," in various places throughout this specification are not necessarily referring to the same embodiment or example of the present disclosure. Furthermore, the particular features, structures, materials, or characteristics may be converted in any suitable manner in one or more embodiments or examples.

In addition, terms such as "first" and "second" are used herein for purposes of description and are not intended to indicate or imply relative importance or significance. Thus, the feature defined with "first" and "second" may comprise one or more this feature. In the description of the present disclosure, "a plurality of" means two or more than two, unless specified otherwise. Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A system for controlling a laser projector, comprising:
a first drive circuit, coupled to the laser projector and configured to output an electrical signal to drive the laser projector to project laser light;
a second drive circuit, coupled to the first drive circuit and configured to supply power to the first drive circuit;
a microprocessor, coupled to the first drive circuit; and
an application processor, coupled to the microprocessor and the second drive circuit, and configured to, read a preset signal from the microprocessor, and power off the second drive circuit to power off the first drive circuit and the laser projector, and/or send a reset signal for restarting the microprocessor to the microprocessor, in response to that the application processor cannot read the preset signal;
wherein the application processor is configured to:
read the preset signal from the microprocessor periodically;
detect whether the laser projector is switched on in response to that the application processor cannot read the preset signal continuously for a plurality of times;
power off the second drive circuit to power off the first drive circuit and the laser projector, and send the reset signal for restarting the microprocessor to the microprocessor, in response to that the laser projector is switched on; and
send the reset signal for restarting the microprocessor to the microprocessor in response to that the laser projector is switched off.

2. The system of claim 1, wherein, the application processor is configured to, read the preset signal from the microprocessor periodically, and power off the second drive circuit to power off the first drive circuit and the laser projector, and/or send the reset signal for restarting the microprocessor to the microprocessor, in response to that the application processor cannot read the preset signal continuously for a plurality of times.

3. The system of claim 1, wherein, the application processor is configured to, read the preset signal from the microprocessor after sending the reset signal for restarting the microprocessor to the microprocessor, and power off the second drive circuit to power off the first drive circuit and the laser projector in response to that the application processor cannot read the preset signal.

4. The system of claim 1, further comprising:
a watchdog timer, coupled to the first drive circuit and the application processor,
wherein, the application processor is configured to send a first predetermined signal to the watchdog timer,
the watchdog timer is configured to, in response to that the first predetermined signal is not received during a first predetermined duration, power off the first drive circuit to power off the laser projector; and/or
send a reset signal for restarting the application processor.

5. The system of claim 4, wherein, the first drive circuit is configured to send a timeout signal to the application processor in response to that a duration of outputting the electrical signal is greater than or equal to a predetermined threshold; and the application processor is configured to stop sending the first predetermined signal to the watchdog timer upon receiving the timeout signal; and
the first drive circuit is configured to stop outputting the electrical signal in response to that the duration of outputting the electrical signal is greater than or equal to the predetermined threshold.

6. The system of claim 1, further comprising:
a watchdog timer, coupled to the first drive circuit and the microprocessor,
wherein, the microprocessor is configured to send a second predetermined signal to the watchdog timer,
the watchdog timer is configured to power off the first drive circuit to power off the laser projector in response to that the second predetermined signal is not received during a second predetermined duration.

7. The system of claim 6, wherein, the first drive circuit is configured to send a timeout signal to the microprocessor in response to that a duration of outputting the electrical signal is greater than or equal to a predetermined threshold; and the microprocessor is configured to stop sending the second predetermined signal to the watchdog timer upon receiving the timeout signal; and
the first drive circuit is configured to stop outputting the electrical signal in response to that the duration of outputting the electrical signal is greater than or equal to the predetermined threshold.

8. The system of claim 1, wherein, the preset signal comprises a flag signal of the microprocessor,
or the preset signal comprises a flag signal of an infrared camera coupled to the microprocessor, in which, the flag signal of the infrared camera is read by the microprocessor and stored in the microprocessor.

9. The system of claim 1, further comprising:
a control circuit, coupled to the first drive circuit and the laser projector, and comprising a resistance element, a detecting element and a switching element,
wherein the detecting element is configured to detect a current flowing through the resistance element, and the switching element is configured to switch off to power off the laser projector in response to that the current is greater than a preset current, or
the detecting element is configured to detect a voltage across the resistance element, and the switching element is configured to switch off to power off the laser projector in response to that the voltage is greater than a preset voltage value.

10. A mobile terminal, comprising:
a laser projector; and
a system for controlling the laser projector, comprising:
a first drive circuit, coupled to the laser projector and configured to output an electrical signal to drive the laser projector to project laser light;
a second drive circuit, coupled to the first drive circuit and configured to supply power to the first drive circuit;
a microprocessor, coupled to the first drive circuit; and
an application processor, coupled to the microprocessor and the second drive circuit, and configured to, read a preset signal from the microprocessor, and power off the second drive circuit to power off the first drive circuit and the laser projector, and/or send a reset signal for restarting the microprocessor to the microprocessor, in response to that the application processor cannot read the preset signal;
wherein the application processor is configured to:
read the preset signal from the microprocessor periodically;
detect whether the laser projector is switched on in response to that the application processor cannot read the preset signal continuously for a plurality of times;
power off the second drive circuit to power off the first drive circuit and the laser projector, and send the reset signal for restarting the microprocessor to the microprocessor, in response to that the laser projector is switched on; and
send the reset signal for restarting the microprocessor to the microprocessor in response to that the laser projector is switched off.

11. The mobile terminal of claim 10, wherein, the application processor is configured to, read the preset signal from the microprocessor periodically, and power off the second drive circuit to power off the first drive circuit and the laser projector, and/or send the reset signal for restarting the microprocessor to the microprocessor, in response to that the application processor cannot read the preset signal continuously for a plurality of times.

12. The mobile terminal of claim 10, wherein, the application processor is configured to, read the preset signal from the microprocessor after sending the reset signal for restarting the microprocessor to the microprocessor, and power off the second drive circuit to power off the first drive circuit and the laser projector in response to that the application processor cannot read the preset signal.

13. The mobile terminal of claim 10, wherein, the system further comprises:
a watchdog timer, coupled to the first drive circuit and the application processor,
wherein, the application processor is configured to send a first predetermined signal to the watchdog timer,
the watchdog timer is configured to, in response to that the first predetermined signal is not received during a first predetermined duration,
power off the first drive circuit to power off the laser projector; and/or
send a reset signal for restarting the application processor.

14. The mobile terminal of claim 13, wherein, the first drive circuit is configured to send a timeout signal to the application processor in response to that a duration of outputting the electrical signal is greater than or equal to a predetermined threshold; and the application processor is configured to stop sending the first predetermined signal to the watchdog timer upon receiving the timeout signal; and
the first drive circuit is configured to stop outputting the electrical signal in response to that the duration of outputting the electrical signal is greater than or equal to the predetermined threshold.

15. The mobile terminal of claim 10, wherein, the system further comprises:
a watchdog timer, coupled to the first drive circuit and the microprocessor,
wherein, the microprocessor is configured to send a second predetermined signal to the watchdog timer,
the watchdog timer is configured to power off the first drive circuit to power off the laser projector in response to that the second predetermined signal is not received during a second predetermined duration.

16. The mobile terminal of claim 15, wherein, the first drive circuit is configured to send a timeout signal to the microprocessor in response to that a duration of outputting the electrical signal is greater than or equal to a predetermined threshold; and the microprocessor is configured to stop sending the second predetermined signal to the watchdog timer upon receiving the timeout signal; and the first drive circuit is configured to stop outputting the electrical signal in response to that the duration of outputting the electrical signal is greater than or equal to the predetermined threshold.

17. The mobile terminal of claim 10, wherein, the system further comprises:

a control circuit, coupled to the first drive circuit and the laser projector, and comprising a resistance element, a detecting element and a switching element, wherein the detecting element is configured to detect a current flowing through the resistance element, and the switching element is configured to switch off to power off the laser projector in response to that the current is greater than a preset current; or the detecting element is configured to detect a voltage across the resistance element, and the switching element is configured to switch off to power off the laser projector in response to that the voltage is greater than a preset voltage value.

18. The mobile terminal of claim 10, wherein, the laser projector is capable of projecting laser light to a target object, the mobile terminal further comprises an infrared camera capable of receiving laser pattern modulated by the target object;

the microprocessor is coupled to the infrared camera, the application processor, and the first drive circuit, and configured to process the laser pattern to obtain a depth image;

in which, the preset signal comprises a flag signal of the microprocessor, or the preset signal comprises a flag signal of an infrared camera coupled to the microprocessor, in which, the flag signal of the infrared camera is read by the microprocessor and stored in the microprocessor.

\* \* \* \* \*